US012628717B2

(12) United States Patent　　　(10) Patent No.:　US 12,628,717 B2
Oehling et al.　　　　　　　　　　(45) Date of Patent:　May 12, 2026

(54) SEMICONDUCTOR MODULE AND POWER SEMICONDUCTOR MODULE

(71) Applicant: SEMIKRON ELEKTRONIK GMBH & CO. KG, Nuremberg (DE)

(72) Inventors: Stefan Oehling, Uttenreuth (DE); Jürgen Steger, Hiltpolstein (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 528 days.

(21) Appl. No.: 18/078,925

(22) Filed: Dec. 10, 2022

(65) Prior Publication Data

US 2023/0197468 A1　　Jun. 22, 2023

(30) Foreign Application Priority Data

Dec. 21, 2021　(DE) ..................... 10 2021 134 003.9

(51) Int. Cl.
*H01L 21/48*　　　(2006.01)
*H01L 21/50*　　　(2006.01)
*H01L 23/053*　　(2006.01)
*H01L 23/10*　　　(2006.01)
*H01L 23/498*　　(2006.01)

(52) U.S. Cl.
CPC ............ *H01L 21/50* (2013.01); *H01L 23/053* (2013.01); *H01L 23/10* (2013.01); *H01L 23/49811* (2013.01)

(58) Field of Classification Search
CPC ............... H01L 21/50; H01L 23/49811; H01L 21/4853; H01L 23/48
See application file for complete search history.

(56) References Cited

U.S. PATENT DOCUMENTS

| | | | | |
|---|---|---|---|---|
| 2010/0284155 A1* | 11/2010 | Stolze | ................. | H01L 23/4006 361/728 |
| 2023/0077384 A1* | 3/2023 | Ludwig | ............... | H01L 25/0655 257/687 |
| 2023/0170287 A1* | 6/2023 | Nolten | .................... | H01L 24/73 257/676 |

FOREIGN PATENT DOCUMENTS

| | | |
|---|---|---|
| DE | 102008058835 A1 | 6/2009 |
| DE | 102012207560 B4 | 11/2013 |
| DE | 102016119631 B4 | 8/2017 |

OTHER PUBLICATIONS

Amendment filed Dec. 16, 2022, in German Patent Application No. 10 2021 134 003.9; Certificate of Translation (1pg English), Original Response (12pgs German), Translated Response (12pgs English) [25 pages].

(Continued)

*Primary Examiner* — Michele Fan
(74) *Attorney, Agent, or Firm* — Andrew F. Young, Esq.; NOLTE LACKENBACH SIEGEL

(57) ABSTRACT

A method for manufacturing a power semiconductor module and a power semiconductor module having, in each case, a housing, a switchgear arranged in this housing and having a plurality of connection elements, has the following method steps: A) forming a housing with pre-fixed connection elements; B) arranging the switchgear in the housing and connecting the connection elements to connection surfaces of a substrate of the switchgear; C) arranging a positioning device for fixing the position of the connection elements with respect to one another; D) fixing the connection elements relative to one another and to the housing.

6 Claims, 4 Drawing Sheets

(56)            References Cited

OTHER PUBLICATIONS

German Office Action dated Sep. 9, 2022, in German Patent
Application No. 10 2021 134 003.9, Certificate of Translation (1pg
English), Original Office Action (4pages German), Translated Action
(4pages English) [total 9 pages].
Response filed Dec. 16, 2022, in German Patent Application No. 10
2021 134 003.9, Certificate of Translation (1pg English), Response
(3pages German), Translated Response (3pages) [total 7 pages].
DE 10 2021 134 003.9, Examination Report dated Sep. 9, 2022, 6
pages—German, 6 pageS—English.

* cited by examiner

SEMICONDUCTOR MODULE AND POWER SEMICONDUCTOR MODULE

CROSS REFERENCE TO RELATED APPLICATIONS

This application relates to and claims priority to DE 10 2021 134 003.9 filed Dec. 21, 2021, the entire contents of which are incorporated herein fully by reference.

FIGURE SELECTED FOR PUBLICATION

FIG. 3.

BACKGROUND OF THE INVENTION

Field of the Invention

The invention describes a method for manufacturing a power semiconductor module having a housing, a switchgear arranged in this housing and having a plurality of connection elements. The invention furthermore describes such a power semiconductor module.

Description of the Related Art

The manufacture of plastic housings for power semiconductor modules is generally known from the prior art, wherein a plurality of connection elements are already arranged in the plastic during the manufacturing process. Such methods are disadvantageous in that the positioning of the individual connection elements with respect to one another or their absolute positioning with respect to the housing may be prone to errors or, in particular, cost-intensive.

ASPECTS AND OBJECTS OF THE INVENTION

With knowledge of the prior art, the invention is based on the object of presenting an alternative manufacturing method for forming a power semiconductor module, in particular a housing for this, and a power semiconductor module itself, wherein the positioning of the connection elements with respect to one another or with respect to the housing does not have to already conform to the final quality requirements during the manufacture of the housing.

This object is achieved according to the invention by a method for manufacturing a power semiconductor module having a housing, a switchgear arranged in this housing and having a plurality of connection elements, having the following method steps:
- A) forming a housing with pre-fixed connection elements;
- B) arranging the switchgear in the housing and connecting the connection elements to connection surfaces of a substrate of the switchgear;
- C) arranging a positioning device for fixing the position of the connection elements with respect to one another;
- D) fixing the connection elements relative to one another and to the housing.

Essentially, here and below, the term "housing" is to be understood in a broad sense and, in this regard, in particular also includes housing parts, in particular also frame-like housing parts. Likewise, the term "connection element" is also to be understood in a broad sense and in particular also includes load connection elements, such as control and auxiliary connection elements, which may be formed for example as solder or plug-type, in particular press-pin, contacts.

In this case, it may be preferred if the connection elements each have a foot portion and a contact portion, wherein, in method step B), the respective foot portion is mechanically connected to an associated connection surface in an electrically conductive manner. In this case, it may be further preferred if the respective contact portions are arranged to be movable with respect to one another, in particular perpendicularly to their longitudinal direction, in one spatial direction, or preferably in two orthogonal spatial directions.

It may be advantageous if the housing is formed as a plastic housing and the connection elements are pre-fixed therein using an injection moulding technique.

In one alternative, it may be advantageous if the positioning device is removed after method step D). In another alternative, it may be advantageous if the positioning device is not removed after method step D) and, in particular, forms part of the housing. In this case, it may be particularly preferred if the connection elements are fixed in position by means of a circumferential second positioning surface in each case or by means of a plurality of second positioning partial-surfaces in each case, each arranged in or at the respective opening in the positioning device.

Essentially, it may be preferred if the connection elements are fixed in position by means of an adhesive compound, with which openings in the housing or in the positioning device are preferably filled. Alternatively to this, it may be preferred if the connection elements are fixed in position by deformation of a deformation portion of the housing or of the positioning device.

In particular, it may be advantageous if the respective connection element is fixed in one spatial direction as a result of a positioning surface or mutually opposing first positioning partial-surfaces of the positioning element lying flush against the connection element during method step C).

The object is furthermore achieved by a power semiconductor module having a housing, a switchgear arranged in this housing and having a plurality of connection elements, wherein the respective connection elements have a first connecting portion, which is arranged in the housing in a form-fitting manner in each case, and a second connecting portion, which is arranged in the housing in a materially-bonded or force-fitting manner in each case.

It may be advantageous if the form-fitting connection is formed as an injection-moulded connection.

Moreover, it may be advantageous if the materially-bonded connection is formed as an adhesive connection, in which the adhesive compound of the adhesive connection is arranged in an opening in the housing. Alternatively, it may be advantageous if the force-fitting connection is formed as a thermal deformation of a deformation portion of the housing.

It goes without saying that the features mentioned in the singular in each case may also be present more than once in the inventive power semiconductor module, unless this is ruled out explicitly or per se or contradicts the idea of the invention.

It goes without saying that the different configurations of the invention, regardless of whether they are mentioned within the context of the manufacturing method or the description of the power semiconductor module, may be realized individually or in any combinations in order to achieve improvements. In particular, the features mentioned and explained above and below can be used not only in the combinations specified, but also in other combinations, or in isolation, without deviating from the scope of the present invention.

Further explanations of the invention, advantageous details and features are revealed in the description below of the exemplary embodiments of the invention, or respective parts thereof, which are illustrated schematically in FIGS. 1 to 7.

The above and other aspects, features, objects, and advantages of the present invention will become apparent from the following description read in conjunction with the accompanying drawings, in which like reference numerals designate the same elements.

Figures 1, 2:
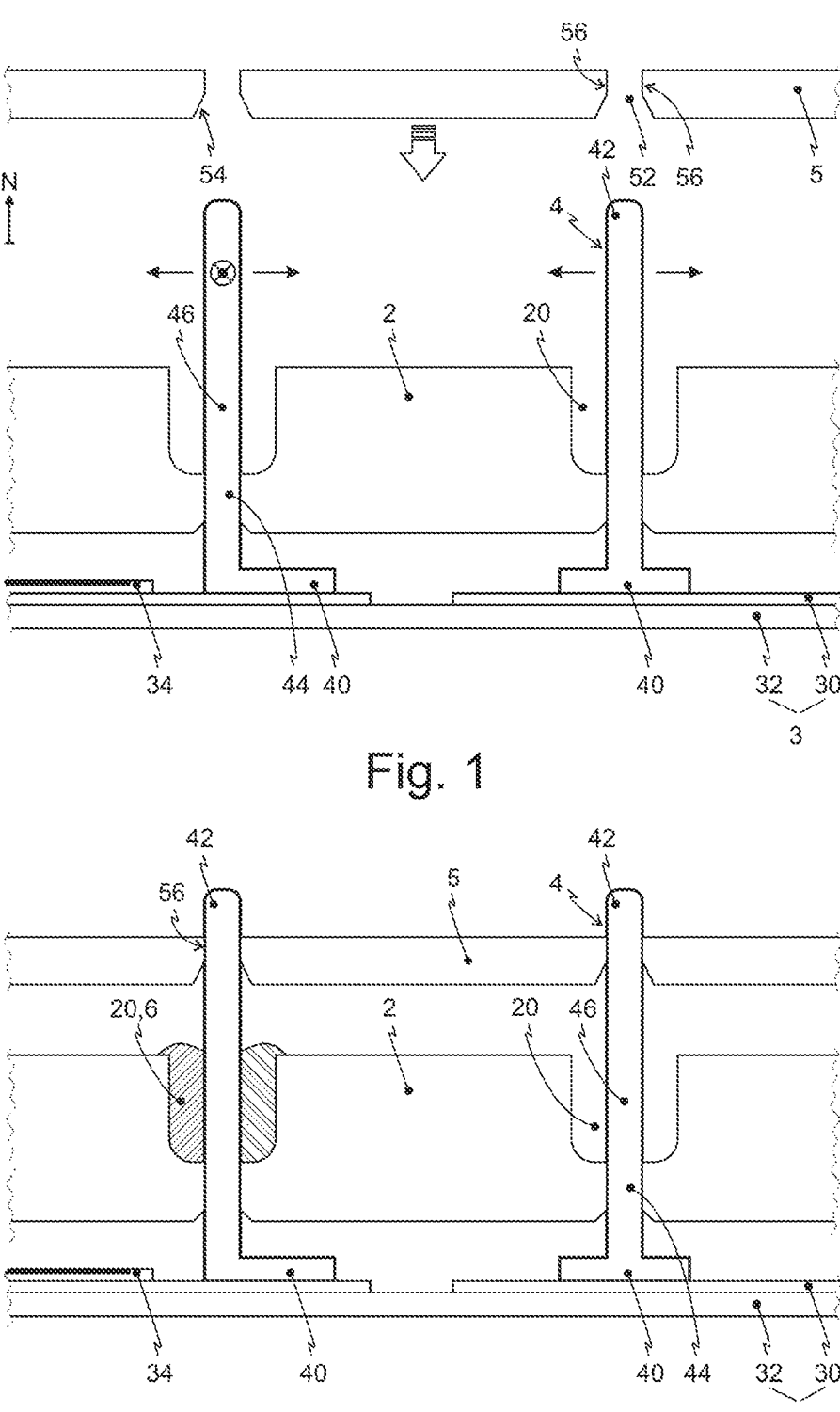
FIGS. 1 to 3 show a first configuration of an inventive method.

DETAILED DESCRIPTION OF THE
PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 3:
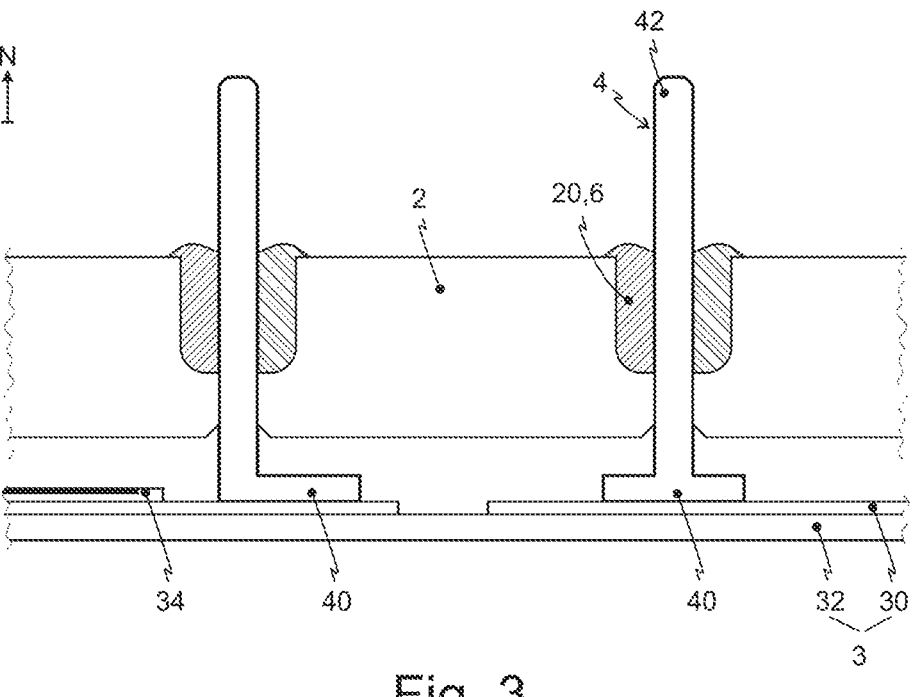

FIGS. 1 to 3 show a first configuration of an inventive method. In this regard, a power semiconductor module according to method step B) is illustrated in FIG. 1. In this power semiconductor module having a housing 2, having a switchgear 3 arranged in this housing 2 and having a plurality of connection elements 4, the housing 2 has been formed in such a way that the connection elements 4 are pre-fixed therein. To this end, the connection elements 4 are already arranged in the housing 2, which is formed as a frame-like plastic housing, during the plastic injection moulding procedure of the manufacturing process. However, this arrangement is flexible in that the connection elements 4, more specifically a respective first connection portion 44, are merely pre-fixed in the housing 2 using an injection moulding technique, i.e., by means of a form-fitting connection. This means that, in particular, the contact portions 42 of the connection elements 4 which project out of the housing 2 may move perpendicularly to their longitudinal direction, which is the same as the normal direction N of the switchgear 3 substrate shown here, as indicated by arrows.

Following the formation of the frame-like plastic housing 2 with the pre-fixed connection elements 4, the switchgear 3 is arranged in or on the housing 2 and the connection elements 4, more specifically the respective foot portion 40 thereof, are mechanically connected to connection surfaces 40 of a substrate 32 of the switchgear 3 in an electrically conductive manner.

FIG. 1 shows the start of method step C), wherein the arrangement of a positioning device 5 takes place. The positioning device 5 has a continuous opening 52 for each connection element 4. The respective opening 52 has a conical portion 54 on its side facing the housing 2. The openings 52 themselves have a first positioning surface 56, or a plurality of first positioning partial-surfaces 56, against which the contact portion 42 of the connection element 4 is intended to lie, and which, together with the opening 52 as such, define the position of the contact portions 42 of the connection elements 4 with respect to one another and, in this case, also with respect to the housing 2. To this end, the reusable positioning device 5, and in particular the position of the openings 52, is produced with the necessary precision.

FIG. 1 shows the start of the arrangement of the positioning device 5 with respect to the housing 2 in method step C). In this case, to fix their position by means of the conical portion 52, the contact portions 42 are slotted into the openings 52 associated with the respective connection element 4. The result is shown in FIG. 2.

After the arrangement of the positioning device 5 in method step C), as illustrated in FIG. 2, the contact portions 42 lie against the first positioning surface 56 in such a way that their previously possible movement capability perpendicular to the longitudinal extent is restricted to the permissible maximum.

FIG. 2 shows the state prior to method step D) for a connection element 4 which is shown on the right. In this case, a second connecting portion 46, which connects the first connecting portion 44 to the contact portion 42 of the connection element 4, is arranged in an opening 20 in the housing 2. Below this opening 20, the connection element 4 having the first connecting portion 44, as described above, is injection-moulded into the housing 2 so that the contact portion 42 and also, to a lesser extent, the second connecting portion 46 are arranged to be movable in two orthogonal spatial directions perpendicular to the longitudinal extent until the arrangement of the positioning device 5 has taken place.

FIG. 2 furthermore shows the completed method step D) for a connection element 4 shown on the left. In this case, in method step D), the connection element 4 is already fixed relative to the housing 2 and to the connection element 4 on the right as a result of filling the opening 20 in the housing 2 with an adhesive compound 6. This adhesive compound 6 may be formed, for example, as a highly-filled plastic adhesive material.

Following method step D), the positioning device 5 is removed again. FIG. 3 finally shows an inventive power semiconductor module having a housing 2, a switchgear 3 arranged in this housing 2 and having a plurality of connection elements 4, wherein the respective connection elements 4 have a first connecting portion 44, which is arranged in the housing 2 in a form-fitting manner, and a second connecting portion 46, which is arranged in the housing 2 in a materially-bonded manner. The contact portions 42 of the respective connection elements 4 are now adequately fixed in position with respect to one another and with respect to the housing 2.

Figure 4:
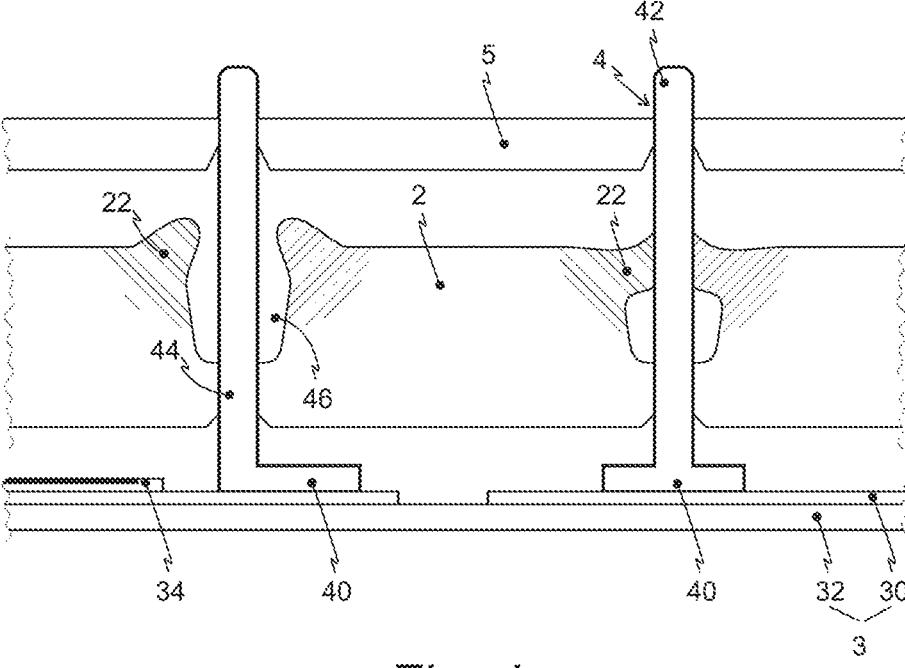
FIG. 4 shows a step of a second configuration of an inventive method.

FIG. 4 shows a step of a second configuration of an inventive method. The substrate 3, the connection elements 4 and the positioning device 5, and also the respective interaction thereof, are the same as described for FIG. 2.

The arrangement of the connection elements 4 in the housing 2, and also their movement capability, are likewise the same. However, the housing 2 has a deformation portion 22 at the upper edge region of the opening 20, in which the second connecting portion 46 is arranged. This deformation portion 46 does not restrict, or at least does not substantially restrict, the movement capability of the second connecting portion 46 and the contact portion 42 of the connection element 4 after method step B).

Within the context of method step D), this deformation portion 22, which may also be formed as a plurality of individual partial deformation portions, is deformed thermally here by means of a heatable die in such a way that the deformation portion 22 lies against the second connecting portion 46 and fixes this, and also the contact portion 42, in the position determined by the positioning device 5.

Figure 5:
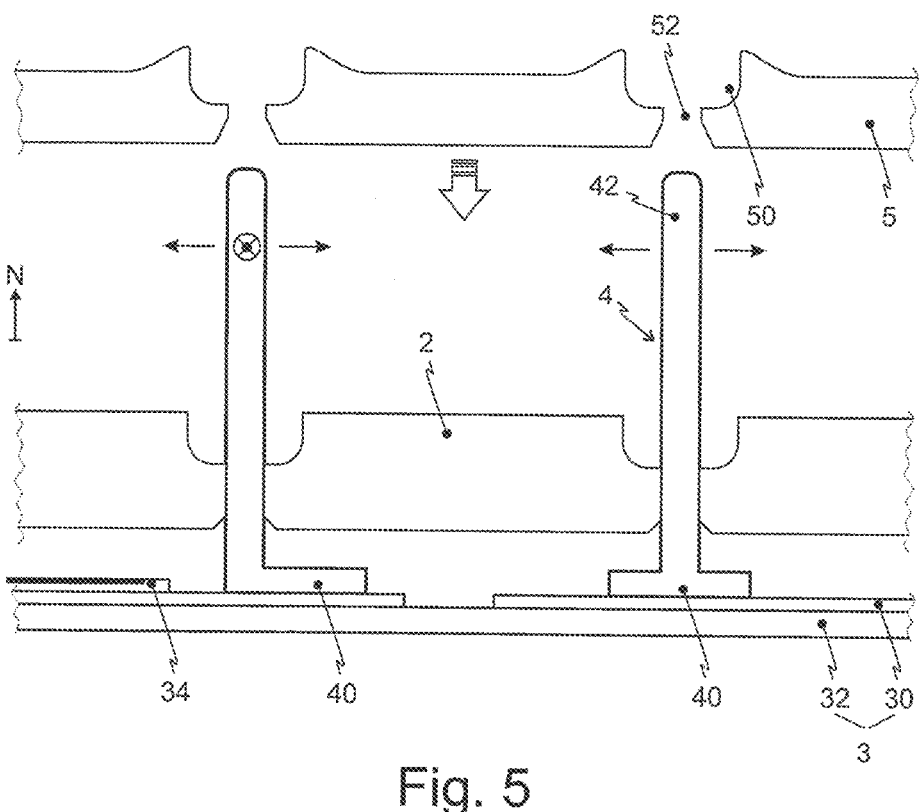
FIGS. 5 and 6 show a third configuration of an inventive method.
Figure 6:
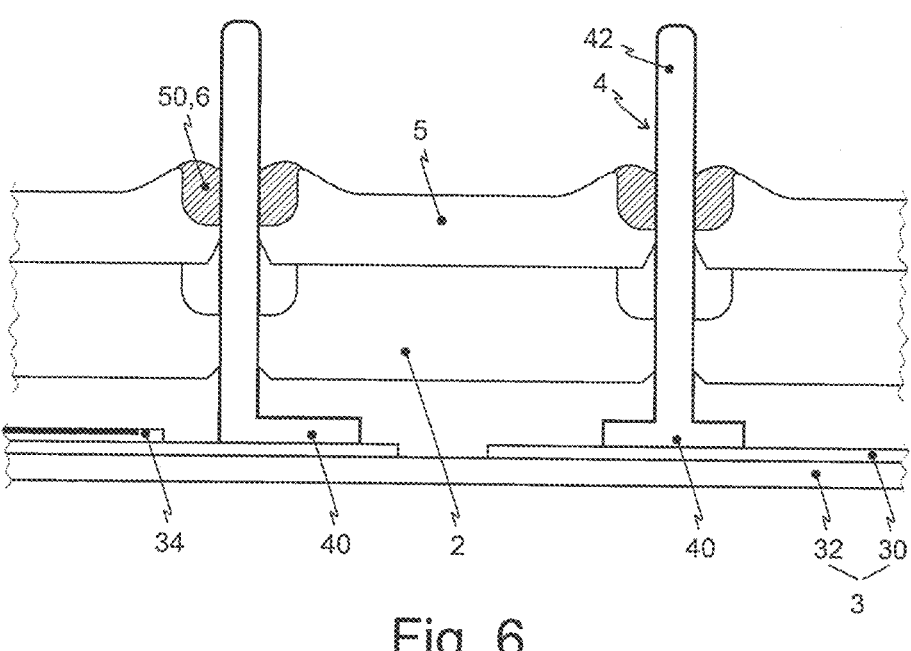

FIGS. 5 to 6 show a third configuration of an inventive method. The substrate 3, the housing 2 and the connection elements 4, and also the respective interaction thereof, are the same as described for FIG. 1.

The arrangement of the connection elements 4 in the housing 2, and also their movement capability, are likewise the same. However, the positioning device 5 has, at the upper edge region, the opening 50 in which the second connecting portion 46 is arranged. In contrast to the first configuration of the inventive method, the positioning device 5 here remains directly on the housing 2 here and is therefore not removed after method step C). The positioning device 5 therefore even forms part of the housing 2 here.

During method step D), it is not, or not only, the opening in the housing 2 which is filled with an adhesive compound 6 (already described), but in particular the opening 50 of the positioning device 5, whereby the connection element 4, and in particular its second connecting portion 46 and also its contact portion 42, is therefore fixed in position.

Figure 7:
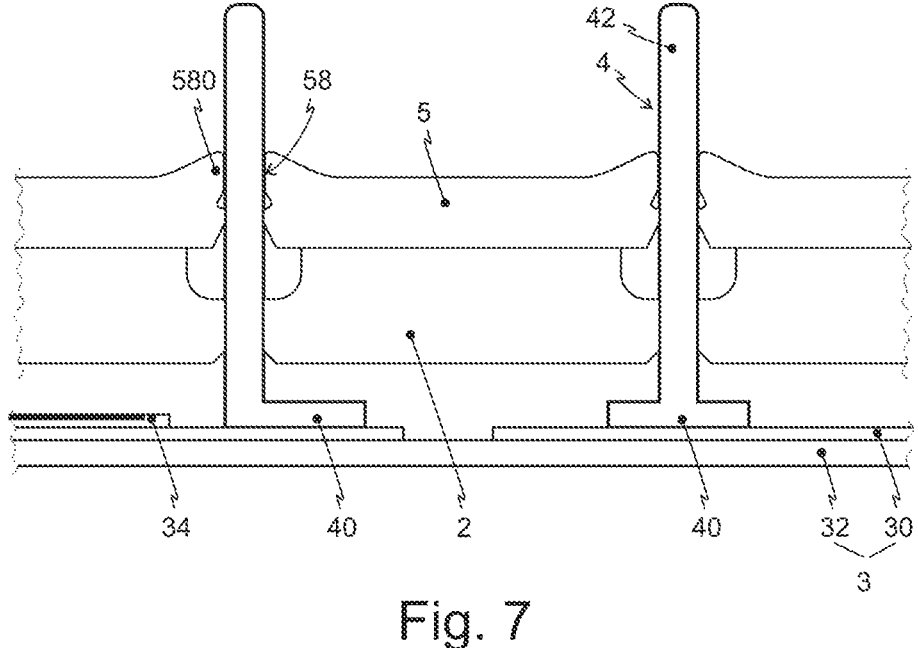
FIG. 7 shows a step of a fourth configuration of an inventive method.

FIG. 7 shows a step of a fourth configuration of an inventive method. The substrate 3, the housing 2 and the connection elements 4, and also the respective interaction thereof, are the same as described for FIG. 1.

The arrangement of the connection elements 4 in the housing 2, and also their movement capability, are likewise the same. However, the positioning device 5 has, at the upper edge region, a second positioning surface 58, which is arranged on the inside of a positioning partial-body 580. By way of example, it is also possible to form more, preferably three, second positioning partial-surfaces of this positioning surface 58, which are preferably arranged in a star shape. In this configuration of the inventive method, the positioning device 5 also remains on the housing 2, in this case directly, and is therefore not removed after method step C). The positioning device 5 in turn forms part of the housing 2 here. Moreover, purely for technical reasons, method step C) and method step D) coincide in a simplifying manner.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A method, for manufacturing a power semiconductor module, said power semiconductor module having a housing (2), a switchgear (3) arranged in the housing (2), and a plurality of connection elements (4), comprising the steps of:

A) forming said housing (2) with a plurality of pre-fixed said connection elements (4);

B) arranging said switchgear (3) in the housing (2) and connecting the connection elements (4) to respective connection surfaces of a substrate of the switchgear (3);

wherein the connection elements (4) each have a foot portion (4) and a contact portion (42);

wherein the Step (B) includes the steps of:

moving one of said contact portions (42) perpendicularly to their longitudinal direction;

and mechanically connecting the respective foot portion (40) to an associated connection surface (30) in an electrically conductive manner;

C) arranging a positioning device (5) with a first circumferential positioning surface for fixing the position of the connection elements; and D) fixing the connection elements (4) relative to one another and to the housing (2);

wherein the housing (2) has openings (20) receiving the connection elements (4);

and the connection elements (4) are fixed in position by an adhesive compound (6) filled into openings (20) in the housing (2) receiving the connection elements (4); and wherein the positioning device (5) and the connection elements (4) are fixed in position to one another and to the housing (2) in a force-fitting manner by a step of deforming the positioning device (5) at a second circumferential second positioning surface (58) arranged at respective positioning openings (52) of the positioning device (5).

2. The method, according to claim 1, wherein:

the housing (2) is formed as a plastic housing and the connection elements (4) are pre-fixed therein formed as an integrated injection molding.

3. The method, according to claim 1, wherein:

the respective connection element (4) is fixed in one spatial direction by at least one first positioning surface (56) of the positioning element (5) lying flush against the connection element (4) during method step C).

4. A power semiconductor module, manufactured by the method, according to claim 1, wherein the respective connection elements (4) each have a first connecting portion (44) arranged in the housing (2) in a form-fitting connection manner.

5. The power semiconductor module, according to claim 4, wherein:

the form-fitting connection is formed as an injection-molded connection.

6. The power semiconductor module, according to claim 4 wherein:

the force-fitting connection is formed as a thermal defor-
mation of a deformation portion (22) of the housing (2).

* * * * *